United States Patent

Wimmer et al.

[11] Patent Number: 5,850,405
[45] Date of Patent: Dec. 15, 1998

[54] METHOD FOR ERROR RECOGNITION OF A DIGITAL BIT DATA STREAM TRANSMITTED BY A TRANSMITTER TO A RECEIVER

[75] Inventors: Bernhard Wimmer; Fritz Seytter, both of München, Germany

[73] Assignee: Siemens Aktiengesellschaft, Munich, Germany

[21] Appl. No.: 735,708

[22] Filed: Oct. 23, 1996

[30] Foreign Application Priority Data

Oct. 23, 1995 [DE] Germany .................. 195 39 343.0

[51] Int. Cl.$^6$ ...................................... G06F 11/10
[52] U.S. Cl. .............................. 371/43.2; 371/43.1
[58] Field of Search .................. 371/43.1–43.8, 371/44, 45, 46

[56] References Cited

U.S. PATENT DOCUMENTS

| | | | |
|---|---|---|---|
| 3,938,085 | 2/1976 | Battail | 371/43.1 |
| 5,208,816 | 5/1993 | Seshardi et al. | 371/43.7 |
| 5,546,420 | 8/1996 | Seshardi et al. | 370/342 |
| 5,668,820 | 9/1997 | Ramesh et al. | 371/43.1 |

OTHER PUBLICATIONS

Hagenauer et al; The Perfromance of Rate–Compatible Punctured Convolutional Codes for Digital Mobile Radio; IEEE Trans. on Communications, Col. 38, No. 7; pp. 966–980, Jul. 1990.

Hagenauer; Rate–Compatible Punctured Convolutional Codes (RCPC Codes) and their Applications; IEEE Trans. on Communications, vol. 36, No. 4; pp. 389–400, Apr. 1988.

Primary Examiner—Reba I. Elmore
Assistant Examiner—Robert Dolan
Attorney, Agent, or Firm—Hill & Simpson

[57] ABSTRACT

In a method for error recognition of a digital bit data stream transmitted by a transmitter to a receiver, a digital bit data stream coded with a convolution coder is quantized to hard bit values. The hard bit values are read in in a forward feedback-coupled inverse shift register that is inverse to the generator shift register used for the coding, and yield a first result word. In a chronologically reversed sequence, the bit data stream is read into a reverse feedback-coupled inverse shift register, which yields a second result word. The two result words are exclusive OR-combined with one another in the same time orientation to form an error syndrome. The error syndrome indicates a set of possibly faulty bit positions in the bit data stream. A transmission rate that is increased in relation to known methods results, since apart from the tail bits, which are used anyway, no additional redundancy is required for the error handling.

6 Claims, 9 Drawing Sheets

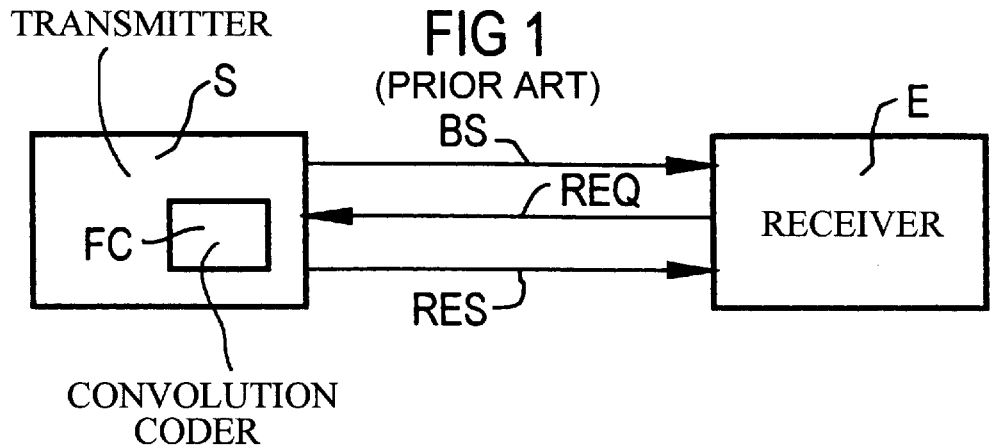
TRANSMITTER
FIG 1
(PRIOR ART)
CONVOLUTION CODER
FIG 2a
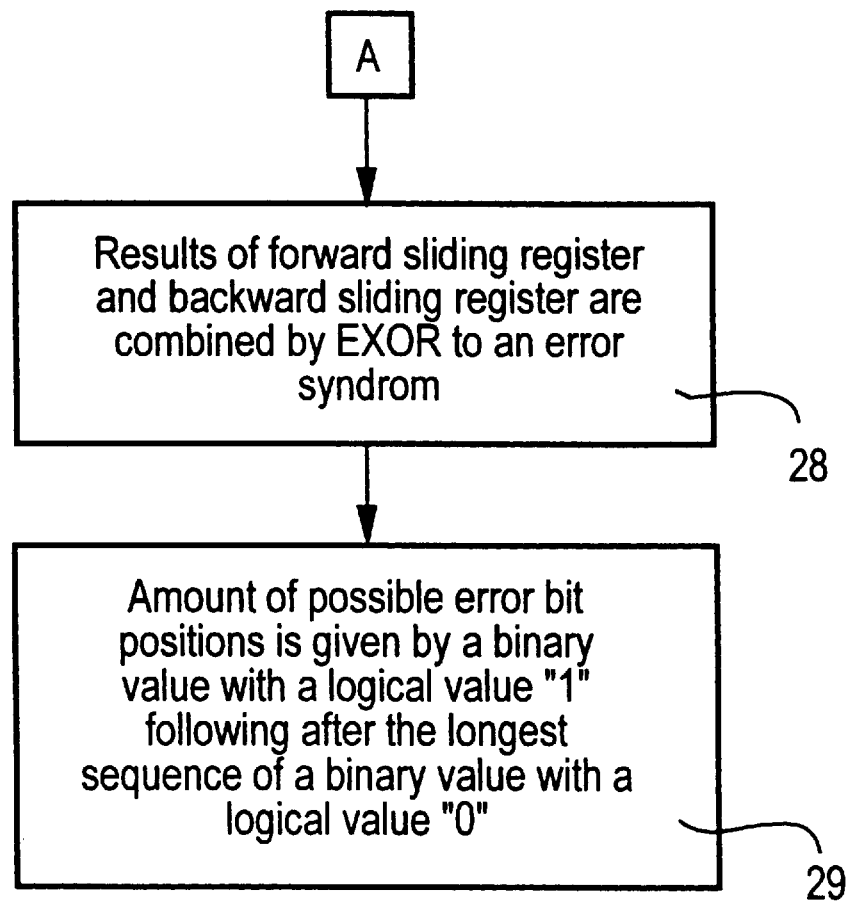

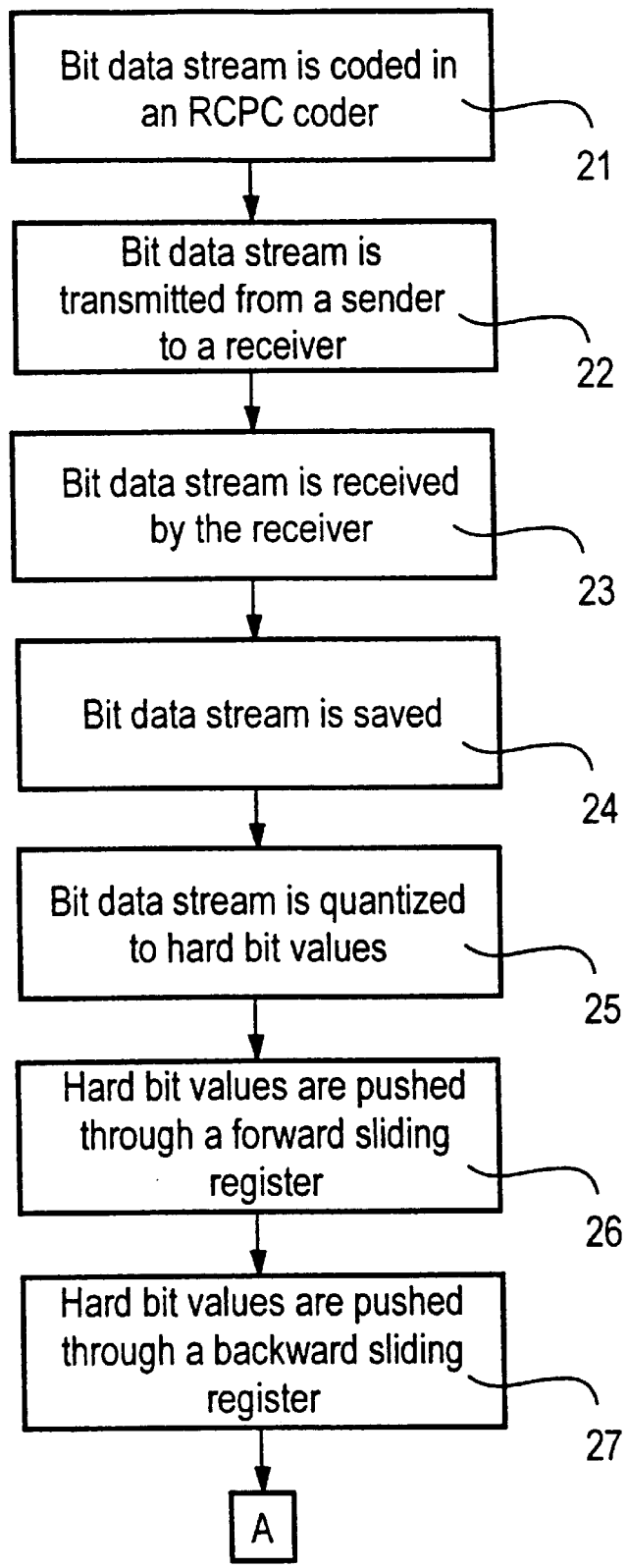

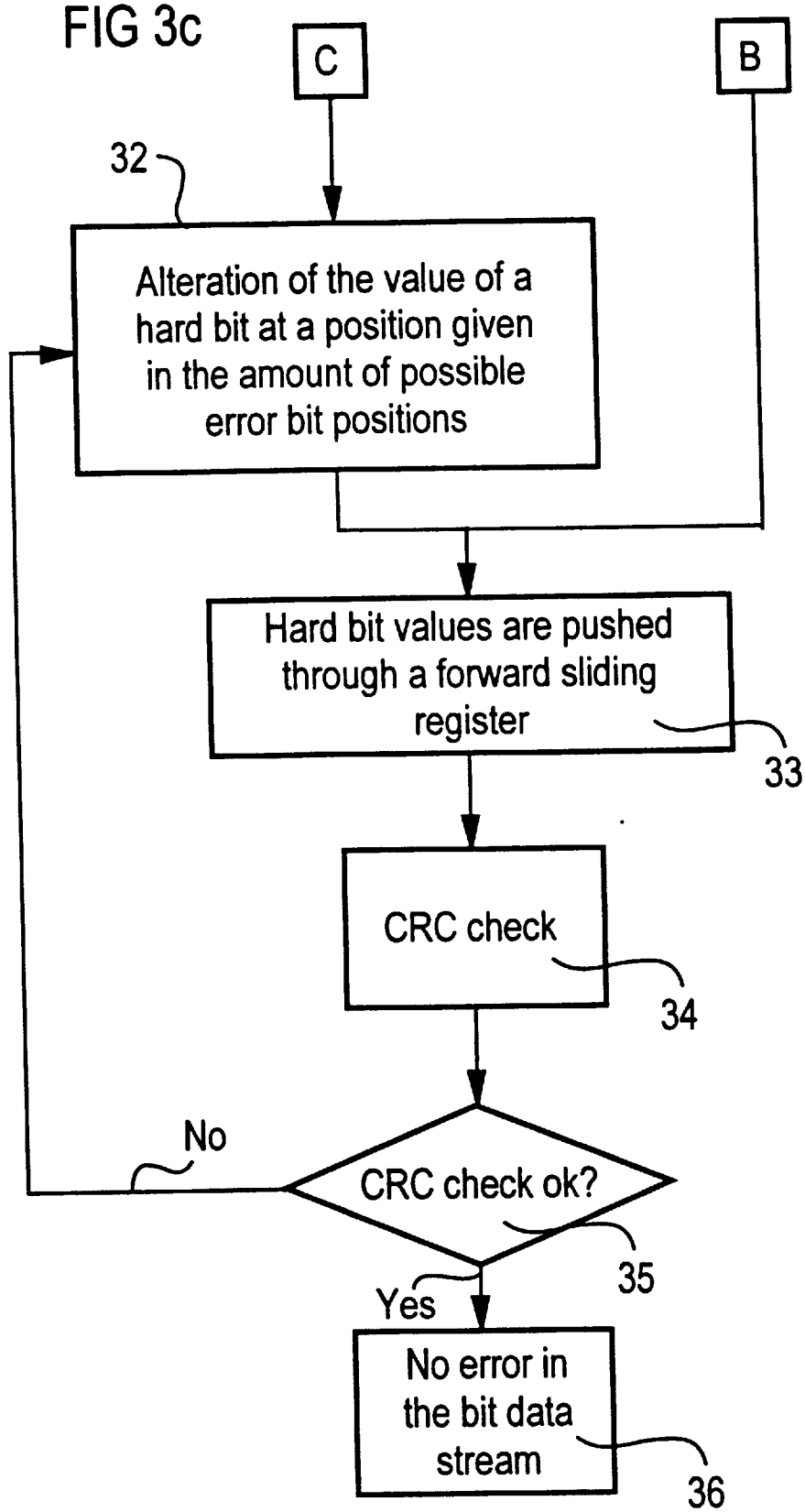

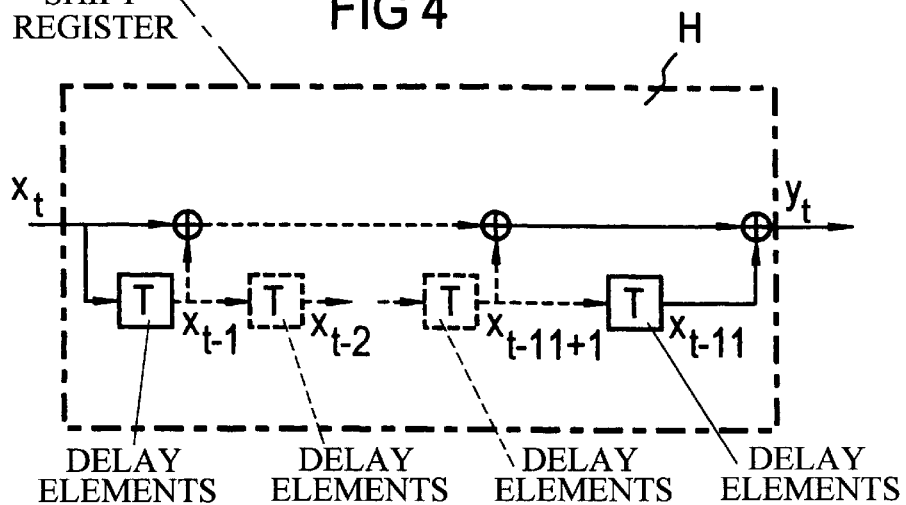
FIG 4
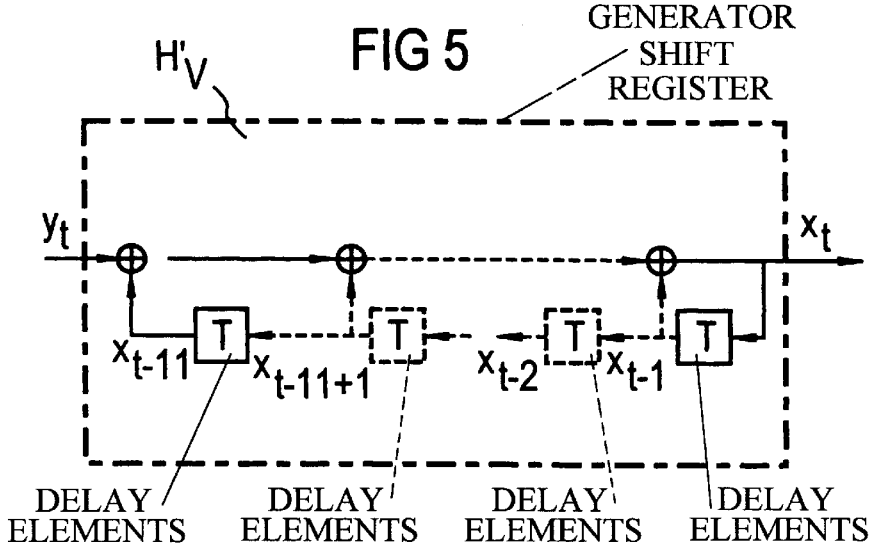
FIG 5
FIG 6 a
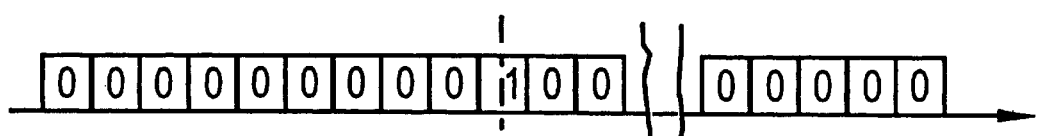
FIG 6 b
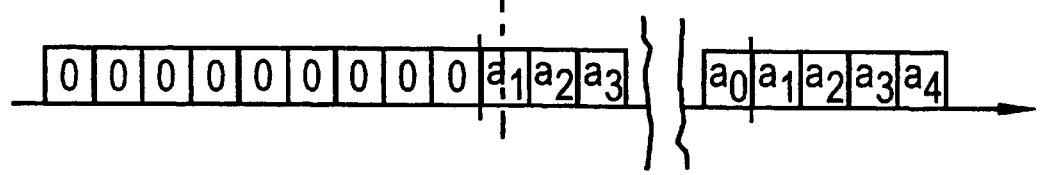

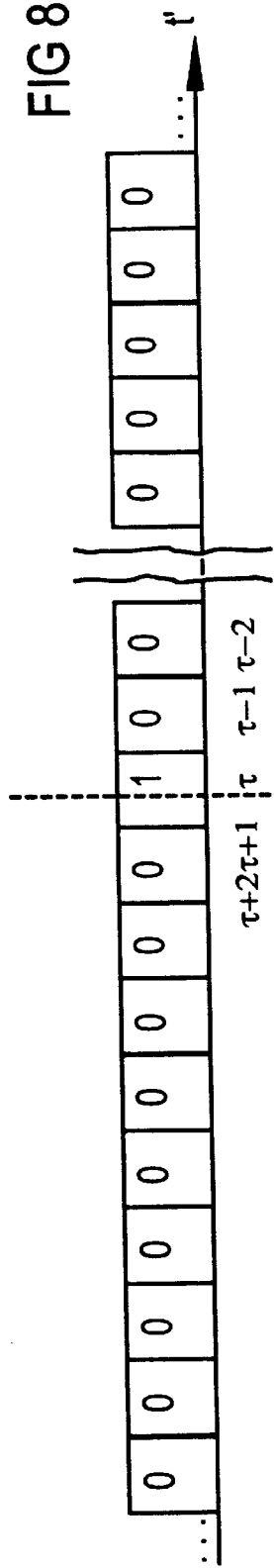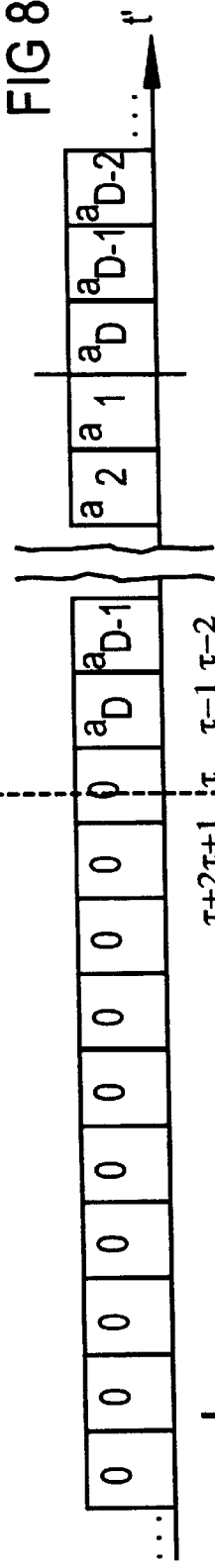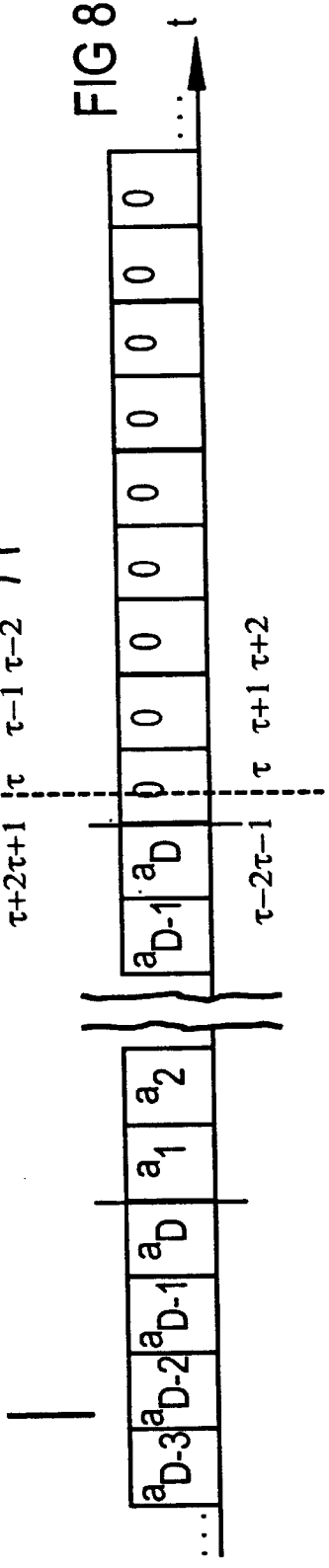

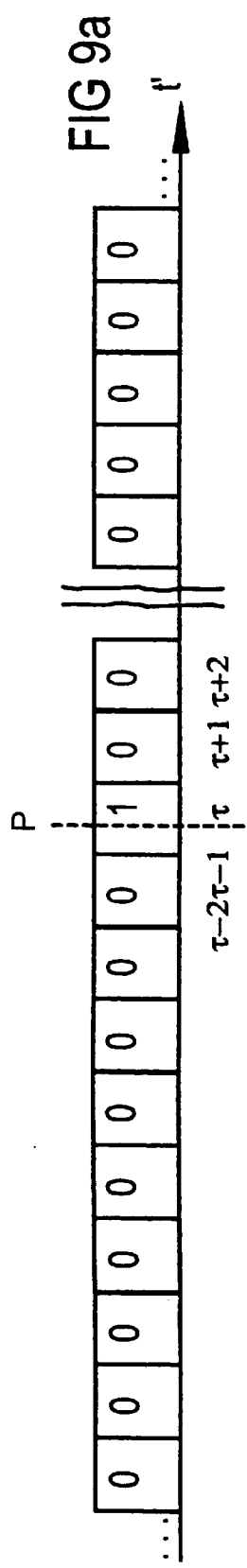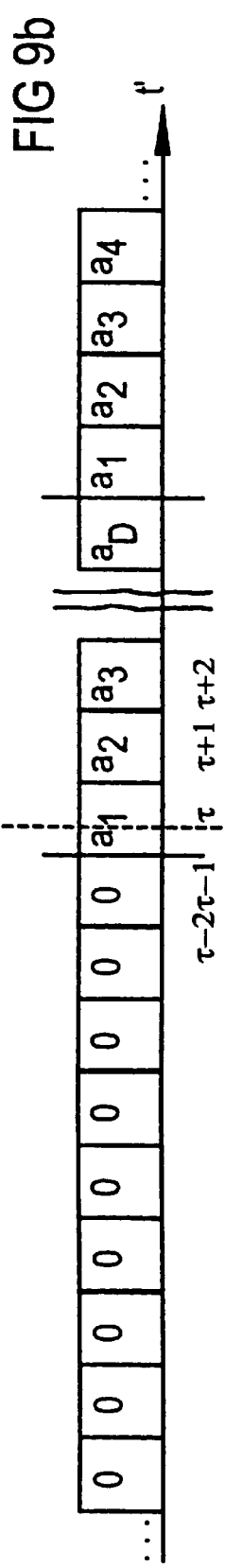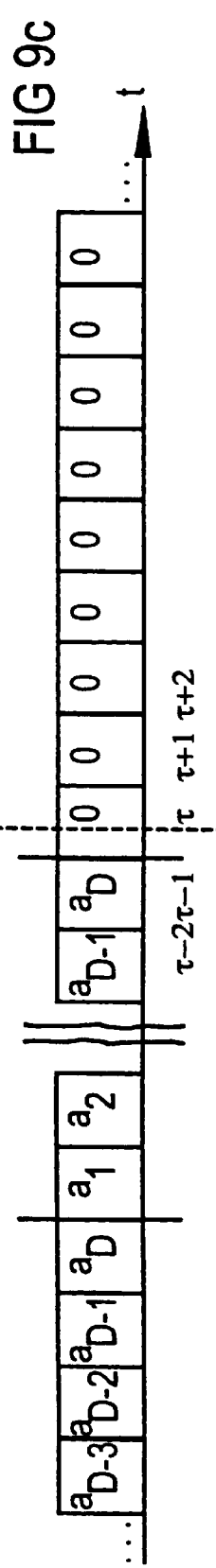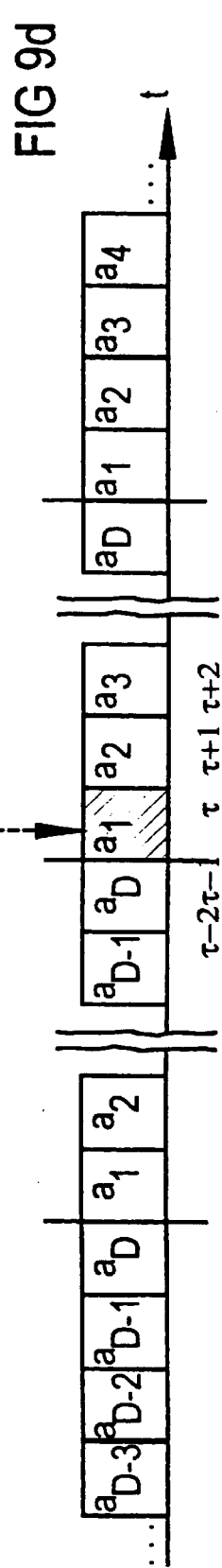

METHOD FOR ERROR RECOGNITION OF A DIGITAL BIT DATA STREAM TRANSMITTED BY A TRANSMITTER TO A RECEIVER

BACKGROUND OF THE INVENTION

1. Field of the Invention

The present invention is directed to a method for error recognition of a digital bit data stream transmitted by a transmitter to a receiver

2. Description of the Prior Art

In the transmission of information via channels which are subject to interference, errors often occur. These errors can be recognized and possibly corrected by means of redundancy added to the actual useful information, however, the effective transmission power is reduced by the added redundancy. By the use of determinate redundancy added to the actual useful information, it is possible to avoid a repetition of the entire useful information by the transmitter upon the occurrence of an error.

A method for error recognition and error correction that exploits purposively determined redundancy is known and is called hybrid automatic repeat request, or the hybrid ARQ method for short. A very efficient method from this category is the hybrid ARQ method type II, known as the rate compatible punctured convolution codes (RCPC codes) (J. Hagenauer, "Rate-Compatible Punctured Convolutional Codes (RCPC Codes) and their Applications," IEEE Transactions on Communications, vol. 36, no. 4, pp. 389–400, Apr. 1988).

In this known method, the useful information is coded in the form of an information sequence, together with a cyclic redundancy check control sample (CRC) and a short termination sequence (tail bits), in a convolution coder with a memory, and is subsequently stored in another memory. The termination sequence is in this case a zero bit sequence of a length corresponding to the size of the memory of the convolution code, and is required for the decoding at the receiver side.

According to a defined standard, a determined number of memory elements is first transmitted. With this information, the receiver attempts to decode the original information word, and thus the useful information, by means of a Viterbi decoder and subsequently by means of a CRC check. If this decoding is not successful, a further small data packet, known as the redundancy, is requested from the transmitter. This packet is considerably smaller than the overall useful information. Moreover, the information contained at the receiver is supplemented, so that an improved correction characteristic of the overall information sequence is ensured.

In the RCPC method, additional information (redundancy) is already transmitted during the first transmission, so that a considerably lower throughput rate in good channels is thereby achieved than with a pure ARQ method. The transmitted additional information (redundancy) leads to a transmission rate R that is smaller than 1.

SUMMARY OF THE INVENTION

An object of the present invention is to provide a method for error handling of a digital bit data stream that fundamentally requires less additional information for error handling of the digital bit data stream than known methods.

The above object is achieved in accordance with the principles of the present invention in a method for error recognition of a digital bit stream transmitted to a receiver by a transmitter, wherein the digital bit data stream is coded in the transmitter in a convolution coder, thereby forming rate compatible punctured convolutional codes using a generator shift register. At the receiver, the digital bit data stream is received in a sequence and is quantized to hard bit values. The hard bit values are pushed through a forward feedback-coupled inverse shift register, and the hard bit values are pushed through a reverse feedback-coupled inverse shift register in a sequence that is chronologically reversed in relation to the reception sequence of the data. The hard bit values which were pushed through the forward feedback-coupled inverse shift register and the hard bit values which were pushed through the reverse feedback-coupled inverse shift register are combined in an exclusive-OR logic gate in the same time orientation, to form an error syndrome. A set of possibly faulty bit positions of the bit data stream is indicated by means of a bit position of a binary value with the logic value of the error syndrome, which position follows the longest sequence of binary values with the logic value zero of the error syndrome. The set of possibly faulty bit positions results from a periodic continuation of the bit position corresponding to the period length of the forward feedback-coupled inverse shift register.

By decoding the received, quantized (thus hard) bit values through a forward shift register and, in a chronologically reversed sequence, through a backward shift register, and by means of the exclusive OR combination of the two resulting values into an error syndrome that indicates at which bit position of the bit data stream an error has possibly occurred, it is possible to recognize an error practically without additional information. The only "additional information" required in this method is the tail bits, however, this causes no additional expense in comparison with a method that codes only the useful information itself, because this termination sequence with the tail bits is necessary if it is to be possible at all to determine an end of the information sequence.

By means of the method, a one-bit error is recognized, i.e. errors in which only one bit was received in a faulty manner in the overall information sequence.

In a further embodiment of the method according to the invention, an error correction is also possible by taking into account in the error correction the knowledge concerning the "reliability" of the received bits that result from the called the soft bit values before the quantization of the bit data stream.

The method is further improved in an embodiment wherein, by means of a provided CRC check, it is also possible to recognize errors beyond a one-bit error.

In another embodiment, it is possible to expand the method for error recognition and to use it for error correction by the receiver requesting an additional redundancy. This additional redundancy can be the determined additional useful information, as is described for example in the aforementioned article by Hagenauer.

The method can also be modified so that the overall message is newly requested and thus newly sent.

DESCRIPTION OF THE DRAWINGS

FIG. 1 schematically illustrates the principle of the ARQ method.

FIGS. 2a and 2b are a flow diagram showing the individual procedural steps of the inventive method.

FIGS. 3a to 3c are a flow diagram showing several additional steps for an embodiment of the inventive method.

FIG. 4 is a block diagram of a general shift register of degree M useable in the inventive method.

FIG. 5 is a block diagram of a forward feedback-coupled shift register inverse to the shift register shown in FIG. 4.

FIGS. 6a and 6b illustrate the impulse response (6b) of the forward feedback-coupled inverse shift register to an impulse (6a) at time T at the input of the forward feedback-coupled inverse shift register respectively shown over a time axis.

FIGS. 8a to 8c are time diagrams showing an applied impulse at the input of the reverse feedback-coupled inverse shift register at time T (8a), an impulse response of the reverse feedback-coupled inverse shift register against the time direction (8b) and the impulse response of the inverse shift resister in the time direction (8c).

FIGS. 9a to 9d are time diagrams showing an impulse at the input of the two shift registers (9a), the impulse responses of the forward feedback-coupled inverse shift register (9b) and the reverse feedback-coupled inverse shift register in the time direction (9c), and the exclusive OR gate (9d) formed from the impulse responses of the forward feedback-coupled inverse shift register and of the reverse feedback-coupled inverse shift register.

DESCRIPTION OF THE PREFERRED EMBODIMENTS

Figure 3A:
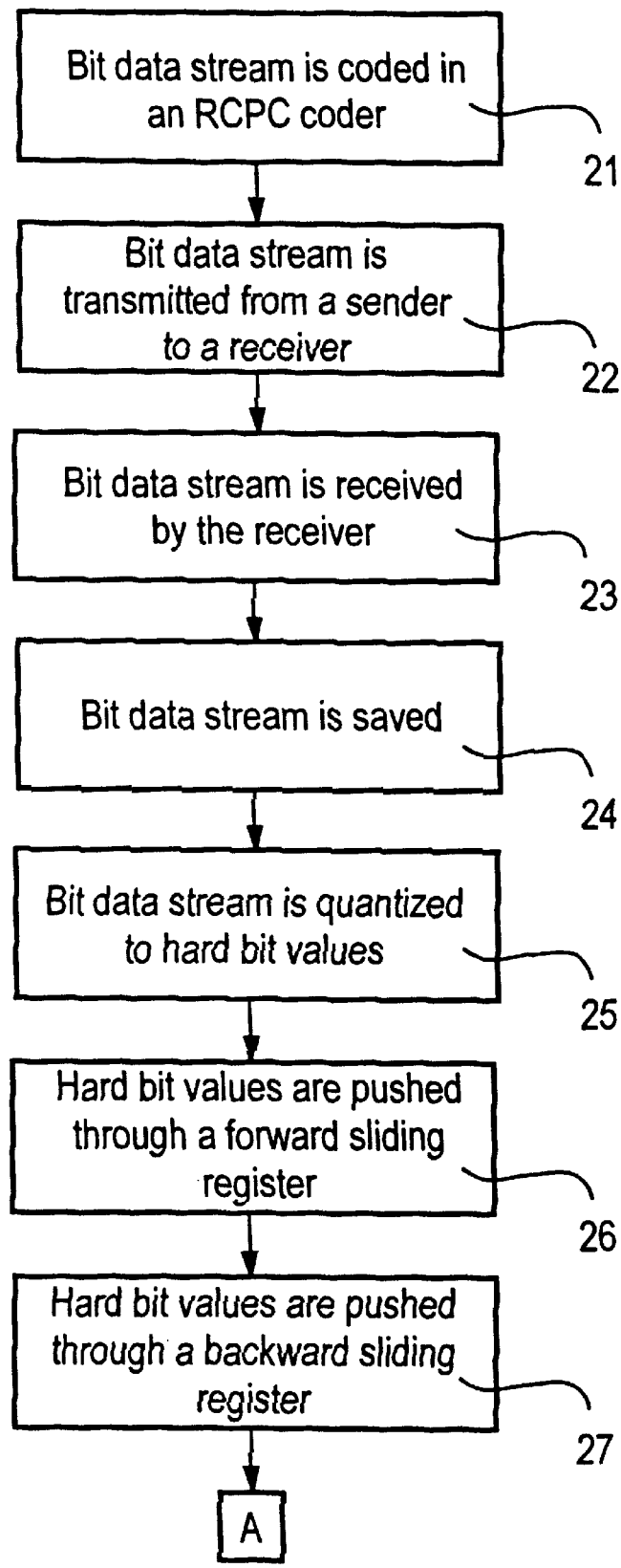
Figure 3B:
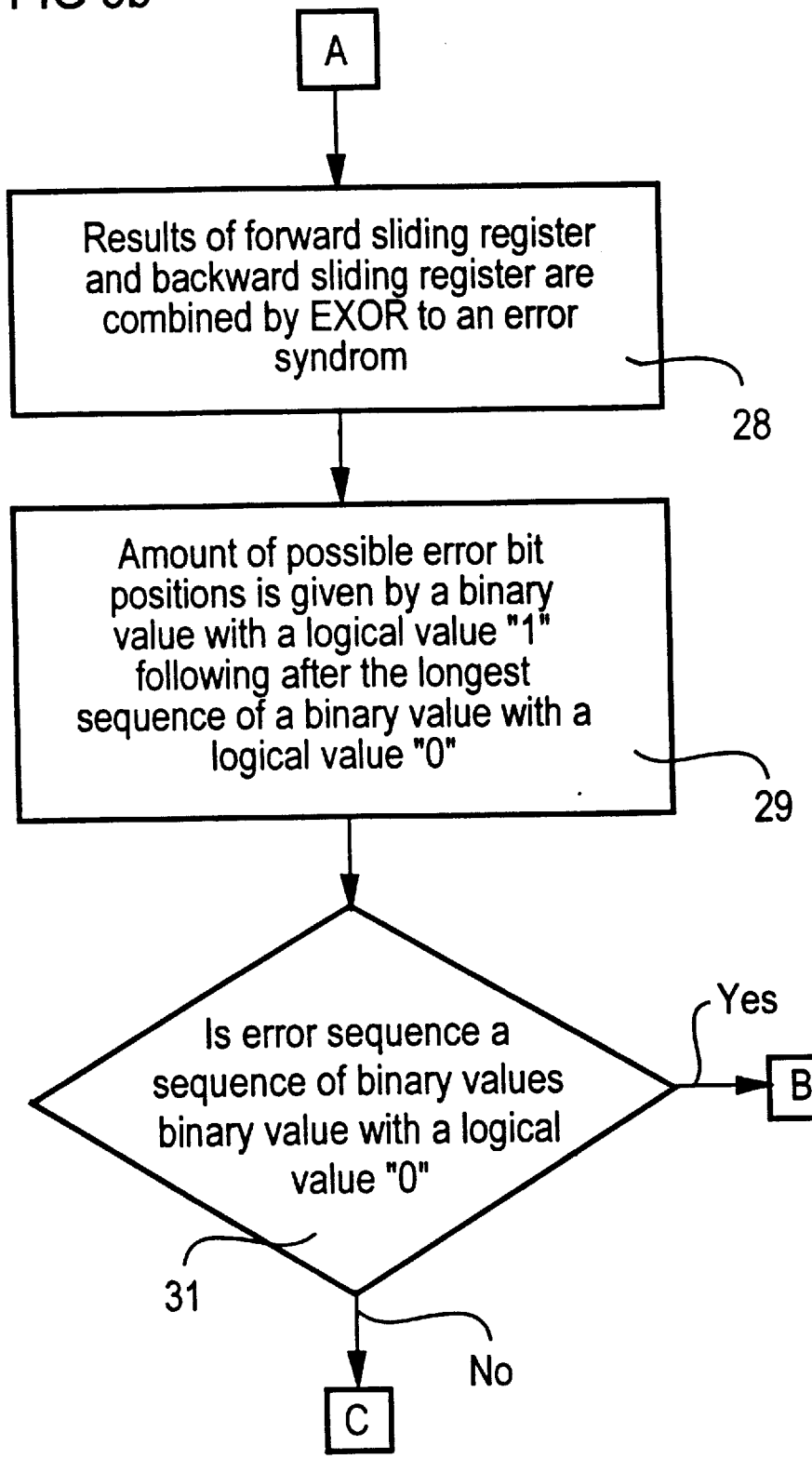

FIG. 1 shows a rough flow scheme of an ARQ method. A transmitter S codes a bit data stream BS in a convolution coder FC and transmits the coded digital bit data stream BS to a receiver E.

At the receiver E, the digital bit data stream BS is decoded and an error handling procedure is carried out. If an error is recognized and the error cannot be corrected directly from the information accessible to the receiver E, the receiver E requests additional information from the transmitter S via a request REQ. This additional information can constitute additional redundancy for the previously transmitted useful information.

The additional information can alternatively constitute the transmission of the entire message once again from the transmitter S to the receiver E. The coding in a convolution coder FC is described in the aforementioned article by Hagenauer.

The additional information RES, additionally sent to the receiver E by the transmitter S, can be used in the receiver E to carry out an error correction of the recognized errors in the digital bit data stream BS.

In FIGS. 2a and 2b, the inventive method is shown in terms its individual procedural steps by means of a flow diagram.

In a first step 21, the digital bit data stream BS is coded by the transmitter S in the convolution coder FC. The bit data stream BS is now transmitted (step 22) to the receiver E by the transmitter S. The receiver E receives the bit data stream BS (step 23) transmitted by the transmitter S, and stores the received information (step 24).

The received bit data stream BS is previously present in so-called soft values, for example, given the use of a 0/1 logic, in analog, noisy signals that lie between zero and one. Of course, the corresponding is true for a −1/1 code, which is also usable.

Other coding methods can be used without limitation within the scope of this method.

Since no digital data processing is possible with the received soft values, the soft values are quantized (step 25) in the receiver E. This means that for each soft value it is decided whether it is allocated to a first binary value or to a second binary value. The type of quantization is arbitrary and can, for example, ensue so as to take into account the specific channel characteristics.

The quantized soft bit values are designated hard bit values in the following. A binary further processing of the bit data stream BS is thus possible.

FIG. 4 shows a general schematic diagram of a generator shift register H of degree M. Delay elements T respectively impose a time delay of the input signal by one time step each.

All the additionally used shift registers must respectively be reset at the beginning of a coding or decoding, i.e. they are standardly pre-assigned the value zero.

An input bit sequence $x_t$ is now pushed through the generator shift register H and coded to an output bit sequence $y_t$ according to the provided exclusive OR gate. This output bit sequence $y_t$ corresponds to the digital bit data stream BS.

The generator shift register H is generally characterized by the following polynomial notation, whereby t represents time:

$$H = y_t = x_t \oplus \ldots \oplus x_{t-M}$$

Two inverse feedback-coupled shift registers can be formed to this generator shift register, shown in FIG. 4.

FIG. 5 shows a forward feedback-coupled inverse shift register $H'_v$. The forward feedback-coupled inverse shift register $H'_v$ uses the bit data stream BS, i.e. the output bit sequence $y_t$, as an input signal. The output signal is the input bit sequence x of the generator shift register H shown in FIG. 4.

The structure of the forward feedback-coupled inverse shift register $H'_v$ results unambiguously from the structure of the generator shift register H:

$$H'_v = x_t = y_t \oplus x_t \oplus \ldots \oplus x_{t-M}$$

The output bit sequence $y_t$ in the sequence is read into the forward feedback-coupled inverse shift register $H'_v$ in the sequence in which it was generated by the generator shift register H.

This means that the hard bit values are pushed through the forward feedback-coupled inverse shift register $H'_v$ (step 26) after the quantization (cf. FIG. 2a).

Over time t, the impulse response of the forward-coupled inverse shift register $H'_v$ to an impulse at the input of the forward feedback-coupled inverse shift register $H'_v$ results at time T (cf. FIG. 6a), as specified in FIG. 6b.

Figure 7:
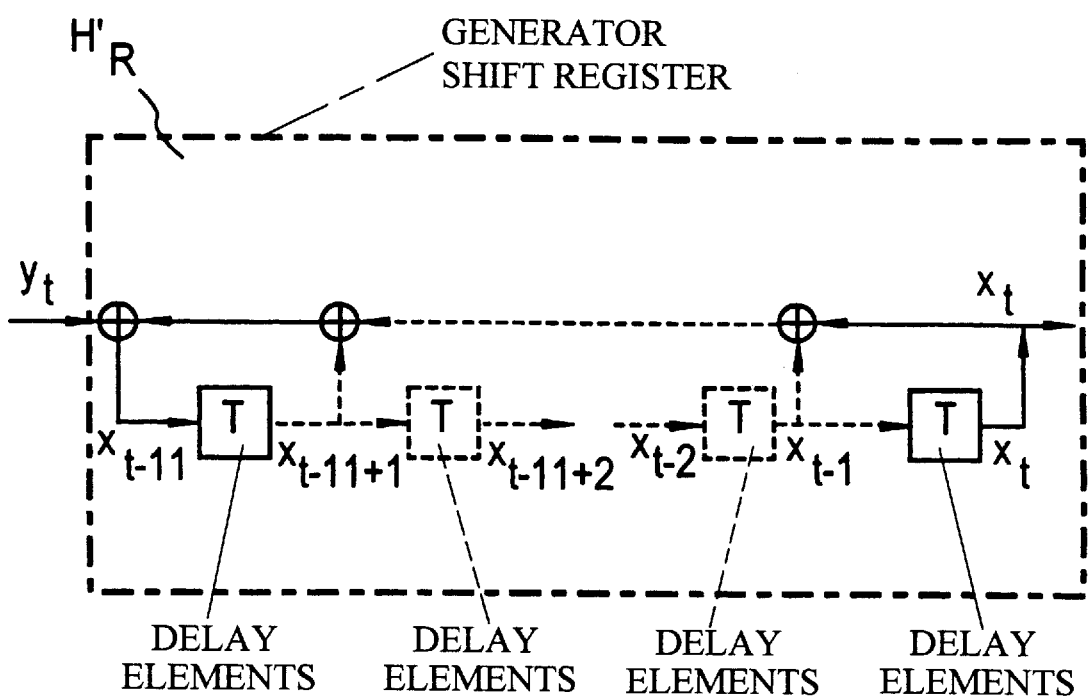
FIG. 7 is a block diagram of a reverse feedback-coupled shift register inverse to the one shown in FIG. 4.

FIG. 7 shows a second inverse shift register, a reverse feedback-coupled inverse shift register $H'_R$. The output bit sequence $y_t$ is in turn used as input signals of the reverse feedback-coupled inverse shift register $H'_R$, but this time in reversed time sequence.

The structure of the reverse feedback-coupled inverse shift register $H'_R$ results unambiguously from the generator shift register H according to the following specification:

$$H'_R = x_{t-M} = y_t \oplus x_t \oplus \ldots \oplus x_{t-M+1}$$

An inventive feature is that the output bit sequence $y_t$ is pushed into the reverse feedback-coupled inverse shift register $H'_R$ in a temporally reversed sequence (step 27) from that in which the output bit sequence $y_t$ was received.

In FIGS. 8a and 8b, the reading in of the output bit sequence $y_t$ of the generator shift register H is indicated by means of a rotated time axis t'. The impulse at the input of the reverse feedback-coupled inverse shift register $H'_R$ at time T, shown in FIG. 8a, leads to the impulse response of the reverse feedback-coupled inverse shift register $H'_R$, shown in FIG. 8b.

The individual bit values of the impulse response are designated $a_{D-x}$, as also in FIG. 6b and FIGS. 9b to 9d. The variable x designates the respective chronological displacement relative to time T of the respective bit value of the impulse response.

The formation of the inverse feedback-coupled shift registers $H'_V$ and $H'_R$, however, can ensue only if the forward feedback-coupled inverse shift register $H'_V$ and the reverse feedback-coupled inverse shift register $H'_R$ are each of degree M and run through all possible states $2^M-1$ during their impulse response, and thus may execute no subcycles.

On the basis of this precondition, the length D of the impulse response results at:

$$D=2^M-1$$

In FIG. 8c, the impulse response is plotted in the "normal" time direction over the time axis t.

The impulse response of the forward feedback-coupled inverse shift register $H'_V$ and the impulse response of the reverse feedback-coupled inverse shift register $H'_R$ are now exclusive-OR-combined into an error syndrome.

Care must hereby be taken that both impulse responses are combined with one another in the "normal" time direction. The impulse responses and the exclusive OR combination of the impulse responses are shown in FIGS. 9a to 9d.

An impulse shown in FIG. 9a at the inputs at time T leads to the impulse responses of the forward feedback-coupled inverse shift register $H'_V$ (cf. FIG. 9b) and to the impulse response of the reverse feedback-coupled inverse shift register $H'_R$ (cf. FIG. 9c).

The exclusive OR combination of the impulse responses is shown in FIG. 9d. The arrow P indicates that from the exclusive OR combination it is possible to infer back only to the time T at which the impulse occurred. As the arrow P indicates, the time T and the occurrence of a first coefficient $a_1$ of the impulse response of the forward feedback-coupled inverse shift register $H'_V$ fall together.

It must be taken into account that this is only possible in an unambiguous way if the period length D of the impulse word, thus the impulse response, is larger than the overall length of the bit data stream BS. If this condition is not met, the impulse can appear at each coefficient $a_1$ of the periodically recurring impulse word.

Since the output bit sequence $x_t$ of the inverse shift register, thus the input bit sequence $x_t$ of the generator shift register, depends only on the memory content of the inverse shift register at past times, thus on $x_{t-1}$, and this depends only on $x_{t-2}$, etc., the output bit sequence $x_t$ of the inverse shift register can be previously determined already at time t-M.

The longest output sequence of a bit sequence exclusively comprising the value zero, thus a zero bit sequence, arises within the impulse response, thus the impulse response, if the memory element $x_{t-M+1}$ has the value logic one and all other memory elements have the value logic zero. Since all states, apart from a continuous sequence exclusively having the values logic zero, must occur within the impulse response (which results from the precondition that no subcycles may be executed in the shift register), this is thus the longest sequence of connected "zeroes." This sequence has length M-1.

For the reverse feedback-coupled inverse shift register $H'_R$, which generates the bit stream against the "normal" time direction t, the above-mentioned memory state occurs directly one clock pulse after the impulse. This means that the coefficients $a_D, \ldots, a_{D-M+2}$ contain this longest "zero" sequence. On the basis of the longest "zero" sequence within the impulse response of the inverse shift register, it is thereby possible to determine the position with the first coefficients $a_1$.

This fact is used for the error handling of the bit data stream BS in the following way. If the transmission of the bit data stream BS via a disturbed channel is observed, this can be described by means of an exclusive OR connection of the bit data stream BS with an error vector $F_K$. If, for example, an error occurs at time t, the error vector $F_K$ has the first binary value only at the position t.

A received bit data stream EB can thus be described as $$EB=BS \oplus F_K.$$

If the received bit data stream EB is received at the receiver E in the forward feedback-coupled inverse shift register $H'_V$, the following is received as a first result word $E_V$:

$$E_V=I\oplus F_V.$$

An information word I is here exclusive OR-combined with a bit sequence $F_V$, which is generated by the error vector $F_K$. Since the error vector $F_K$ can have only one binary value with the value logic one in the bit stream, the bit sequence $F_V$ can be interpreted as the impulse response of the forward feedback-coupled inverse shift register $H'_V$ (cf. FIGS. 6a and 6b).

If this step is also carried out with reverse feedback-coupled inverse shift registers $H'_R$, and the result is regarded in the "normal" time direction t, the following results for a second result word $E_R$:

$$E_R=I\oplus F_R.$$

Analogously to the above-specified impulse response of the forward feedback-coupled inverse shift register $H'_V$, a second bit sequence $F_R$ is the impulse response of the reverse feedback-coupled inverse shift register $H'_R$ in the "normal" time direction t (cf. FIGS. 8a to 8c).

During the subsequent exclusive OR combination 28 of the first result word $E_V$ with the second result word $E_R$ to form the error syndrome $F_{VR}$, the following results:

$$F_{VR}=E_V\oplus E_R=I\oplus F_V\oplus I\oplus F_R=F_V\oplus F_R.$$

The error syndrome $F_{VR}$ is independent of the actual information word I and is dependent only on the first bit sequence $F_V$ and on the second bit sequence $F_R$ and is thus actually dependent only on the error vector $F_K$. The binary value with logic value one that follows the longest "zero" sequence in the error syndrome $F_{VR}$ thus indicates the bit position in the bit data stream BS in which an error has occurred.

For the case in which the period length D of the impulse response is smaller than the overall length of the bit data stream BS, only a set of possibly faulty bit positions of the bit data stream BS is indicated through the error syndrome $F_{VR}$, by the bit with the value logic one following the longest "zero" sequence.

The set of possibly faulty bit positions results from the periodic continuation of the impulse word in the error syndrome $F_{VR}$. This means that a possibly faulty bit position in the bit data stream BS results from the bit position indicated in the error syndrome $F_{VR}$ plus $n \times D(D=2^M-1)$, whereby M indicates the degree of the generator shift register H used and n is an arbitrary natural number.

It is thus possible by means of the inventive method to carry out an error handling procedure for the bit data stream BS without requiring additional redundancy. This is an important advantage in relation to the known RCPC method, in which the bit data stream BS already has a certain redundancy, which leads to a transmission rate R that is smaller than 1.

The only redundancy required for the inventive method lies in the M tail bits which, however, are required anyway as a termination sequence for the bit data stream BS. These tail bits are required in the inventive method in order to bring the shift register into a defined state.

In an embodiment of the method, the information concerning which bit position of the bit data stream BS in which an error can possibly be located is exploited in the following way.

The bit of the bit data stream BS, whose bit position is contained in the set of the possibly faulty bit positions, and which has the greatest uncertainty in the soft values of the bit data stream BS before the quantization, is altered. The greatest uncertainty means in this context that the bit which is to be altered differs most from the quantized hard bit value, and thus lies closest to the quantization threshold. Of course, only the bit values are taken into account which are at the bit positions that are contained in the set of possibly faulty bit values.

The bit data stream BS with the soft bit values that were stored in a step 24 is thus used for the selection of the hard bit value to be altered. The corresponding value of the hard bit values is now altered (step 32).

Of course, this ensues only if the error syndrome is not exclusively a sequence of binary values with the value logic zero (step 31).

The altered sequence of hard bit values is now in turn pushed through the forward feedback-coupled inverse shift register $H'_V$ for decoding (step 33). For the case in which no errors were recognized, and thus the error syndrome $F_{VR}$ is exclusively a sequence of binary values with the value logical zero, the first result word $E_V$, which arose in step 26 by the pushing of the hard bit values through the forward feedback-coupled inverse shift register $H_V$, can also be used directly.

Since only one error can be recognized by means of the inventive method as described thus far, in a further embodiment of the method more errors can also be recognized by means of a cyclic redundancy check (CRC) (step 34), with an error recognition probability corresponding to the shift register that is used for the CRC check.

For the case in which a CRC check is provided, a CRC checksum is of course added during the coding of the bit data stream BS by the transmitter S.

These CRC checksums are evaluated by the receiver E (step 35). If no errors are determined even after the CRC check, it can be assumed that no error has occurred in the bit data stream BS (step 36). Since the CRC check is used on the possibly already-corrected bit stream, thus the altered hard bit values are used, it can also be checked whether the correct bit from the set of possibly faulty bits of the bit data stream BS was corrected.

If the CRC check shows that an important bit of the bit data stream BS was altered, thus a false correction took place, another bit, at a position likewise from the set of possibly faulty bit positions, can be altered. It is advantageous to carry out the sequence of the correction of the individual bits in such a way that the bit with the highest uncertainty is respectively corrected. Of course, the falsely corrected bit must then be set again to the correct, original value.

This procedure can be repeated until the CRC check yields a positive result.

In addition to the procedure described above, it is also possible for the receiver E to request additional redundancy from the transmitter S by means of a request REQ.

The transmitter S transmits the requested additional redundancy to the receiver E in a response RES.

This procedure can be repeated until the receiver E has received enough redundancy to carry out an error correction.

It is likewise possible for the receiver E to request a repetition of the entire message by means of the request REQ.

In this case, the transmitter S sends the entire bit data stream BS an additional time to the receiver E in the response RES.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for error recognition of a digital bit data stream transmitted to a receiver by a transmitter comprising the steps of:

coding a digital bit data stream in the transmitter in a convolution coder and thereby forming rate compatible punctured convolutional codes using a generator shift register H expressed as $H=y_t=x_t \oplus \ldots \oplus x_{t-M}$, wherein $y_t$ is an output bit sequence of the generator shift register H, $x_t$ is an input bit sequence of the generator shift register H, t designates individual time steps and M designates the degree of the generator shift register H;

and conducting steps in the receiver comprising:

receiving the digital bit data stream in a sequence;

quantizing the digital bit data stream to hard bit values;

pushing the hard bit values through a forward feedback-coupled inverse shift register $H'_V$ expressed as $H'_V = x_t = y_t \oplus x_{t-1} \oplus \ldots \oplus x_{t-M}$;

pushing the hard bit values through a reverse feedback-coupled inverse shift register $H'_R$ expressed as $H'_R = x_{t-M} = y_t \oplus x_t \oplus \ldots \oplus x_{t-M+1}$ in a sequence that is chronologically reversed in relation to the sequence of the reception of the data;

exclusive-OR combining the hard bit values pushed through the forward feedback-coupled inverse shift register $H'_V$ and pushed through the reverse feedback-coupled inverse shift register $H'_R$ in the same time orientation, to form an error syndrome; and indicating a set of possibly faulty bit positions of the bit data stream by means of a bit position of a binary value with the logic value one of the error syndrome, which position follows a longest sequence of binary values with the logic value zero of the error syndrome, the set of possibly faulty bit positions resulting from a periodic continuation of the bit position corresponding to a period length of the forward feedback-coupled inverse shift register $H'_V$.

2. A method according to claim 1 comprising the additional steps of requesting additional redundancy from the receiver for error correction and transmitting the additional redundancy from the transmitter to the receiver upon the request from the receiver.

3. A method according to claim 1 comprising the additional step of a CRC check of the hard bit values pushed through the forward feedback-coupled inverse shift register $H'_v$.

4. A method according to claim 3, comprising the additional steps of:

(a) given a negative result of the CRC check, altering another bit of the hard bit values, which is located at a bit position of the set of possibly faulty bit positions, whose received value in the bit data stream has a lower uncertainty than the previously altered bits;

(b) conducting a CRC check of the altered hard bit values; and (c) repeating steps (a) and (b) until the CRC check yields a positive result.

5. A method according to claim 1, comprising the additional steps of:

altering a bit of the hard bit values, which bit is located at a bit position of the set of possible faulty bit positions whose received value has the greatest uncertainty in the bit data stream; and pushing the altered hard bit values through the forward feedback-coupled inverse shift register $H'_v$.

6. A method according to claim 1 comprising the additional step of a CRC check of the altered hard bit values pushed through the forward feedback-coupled inverse shift register $H'_v$.

* * * * *